(12) United States Patent
Jung

(10) Patent No.: US 8,138,086 B2
(45) Date of Patent: *Mar. 20, 2012

(54) METHOD FOR MANUFACTURING FLASH MEMORY DEVICE

(75) Inventor: Chung-Kyung Jung, Anyang-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 166 days.

This patent is subject to a terminal disclaimer.

(21) Appl. No.: 12/636,035

(22) Filed: Dec. 11, 2009

(65) Prior Publication Data

US 2010/0163964 A1 Jul. 1, 2010

(30) Foreign Application Priority Data

Dec. 30, 2008 (KR) .................. 10-2008-0136471

(51) Int. Cl.
*H01L 21/44* (2006.01)

(52) U.S. Cl. ........ 438/663; 438/706; 438/745; 438/509; 257/E21.006

(58) Field of Classification Search .................. 257/296, 257/324, E29.309, E21.409; 438/261, 663, 438/706, 745, 509

See application file for complete search history.

(56) References Cited

U.S. PATENT DOCUMENTS 8,003,531 B2 * 8/2011 Jung .............................. 438/663

* cited by examiner

*Primary Examiner* — Roy Potter
(74) *Attorney, Agent, or Firm* — Sherr & Vaughn, PLLC

(57) ABSTRACT

A method of manufacturing a flash memory device and devices thereof, which may be capable of preventing damage to a gate. A method of manufacturing a flash memory device may include preparing a semiconductor substrate having an active region defined by a device separator. A method of manufacturing a flash memory device may include forming a floating gate, a oxide-nitride-oxide (ONO) layer and/or a control gate layer on and/or over a substrate. A method of manufacturing a flash memory device may include forming a low temperature oxide (LTO) film on and/or over a control gate, etching a LTO film to expose a desired part of a control gate, using a LTO film as a mask to etch a desired part of each of a floating gate layer, a ONO layer and/or a control gate to form a gate pattern, and/or substantially removing a LTO film by wet etching.

10 Claims, 3 Drawing Sheets

METHOD FOR MANUFACTURING FLASH MEMORY DEVICE

Figure 1A:
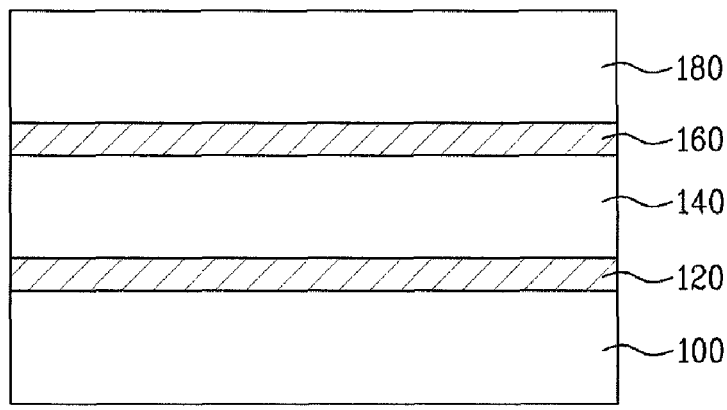

The present application claims priority under 35 U.S.C. 119 to Korean Patent Application No. 10-2008-0136471 (filed on Dec. 30, 2008) which is hereby incorporated by reference in its entirety.

BACKGROUND

Embodiments relate to a method of manufacturing a flash memory device and devices thereof. Some embodiments relate to a method of manufacturing a flash memory device which may be capable of preventing damage to a gate, and devices thereof.

A flash memory device may be a programmable ROM ("PROM") which may write, delete and/or read information. A flash memory device may include a NOR type structure where cells may be aligned in parallel between a bit line and a ground. A flash memory device may include a NAND type structure where cells may be aligned in series between a bit line and a ground based on a cell array system. A NOR type flash memory device may enable implementation of relatively high speed random access during reading, and/or may be used to boot up a system, such as a cell phone. A NAND type flash memory device may include a relatively low reading speed but may include relatively high writing speed, may be suitable for data storage and/or may be enable miniaturization of a device.

A flash memory device may include a laminate gate structure having a floating gate and/or a control gate. A laminate gate structure may include a double-layered conductive polysilicon structure having a floating gate and/or a control gate laminated on and/or over a tunnel oxide film. A capacitor structure including a oxide-nitride-oxide (ONO) layer, which may operate as an interlayer insulating film, may be interposed between a floating gate and a control gate. Bias may be applied to a control gate, pass through a ONO layer, and may again be applied to a floating gate according to a coupling ratio, such that a program and/or an erase operation may be performed under a relatively high bias. However, a tendency to relatively decrease a size of a flash memory device has trended toward minimizing the size of a line width of a gate pattern including a floating gate, a ONO film and/or a control gate. Therefore, damaging a gate by dry etching and/or wet etching conducted during formation of a gate pattern is a concern.

Accordingly, there is a need for a method of manufacturing a flash memory device which may be capable of preventing damage to a gate, and devices thereof.

SUMMARY

Embodiments relate to a method of manufacturing a flash memory device and devices thereof. According to embodiments, a method of manufacturing a flash memory device and devices thereof may be capable of preventing damage to a gate.

According to embodiments, a method of manufacturing a flash memory device may include preparing a semiconductor substrate having an active region defined by a device separator. In embodiments, a method of manufacturing a flash memory device may include forming a floating gate, a ONO film and/or a control gate on and/or over a substrate, for example in sequential order. In embodiments, a method of manufacturing a flash memory device may include forming a low temperature oxide (LTO) film on and/or over a control gate. a method of manufacturing a flash memory device may include selectively etching a LTO film which may expose a desired part of a control gate. A method of manufacturing a flash memory device may include using a LTO film as a mask to etch a desired part of a floating gate, a ONO film and/or a control gate, which may form a gate pattern. A method of manufacturing a flash memory device may include substantially removing a LTO film, for example by wet etching.

According to embodiments, a method of manufacturing a flash memory device may include a LTO film. In embodiments, a method of manufacturing a flash memory device may relatively rapidly substantially remove a LTO film by a vapor phase cleaning (VPC) process. In embodiments, damage to a gate pattern may be minimized. In embodiments, generation of an undercut may be minimized. In embodiments, relative increase in area of forming salicide which may be caused by an undercut during salicide formation as a post process may be minimized. In embodiments, a channel length between a source and a drain may be minimized.

DRAWINGS

Example FIG. 1A to FIG. 1D are cross-sectional views illustrating a method of manufacturing a flash memory device in accordance with embodiments.

Figure 2:
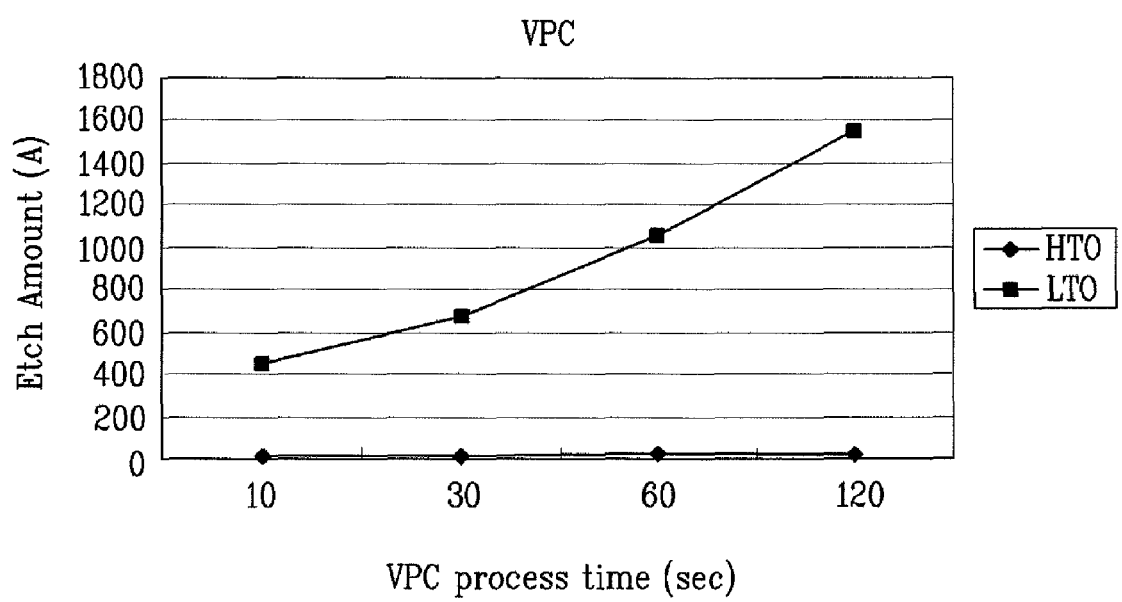

Example FIG. 2 is a graph illustrating a vapor phase cleaning (VPC) process using a high temperature oxide (HTO) and a VPC process using a low temperature oxide (LTO) in accordance with embodiments.

DESCRIPTION

Embodiments relate to a method of manufacturing a flash memory device and devices thereof. Referring to example FIG. 1A to FIG. 1D, cross-sectional views illustrate a method of manufacturing a flash memory in accordance with embodiments. According to embodiments, a plurality of device separators spaced from one another, for example at substantially constant intervals, may be disposed on and/or over semiconductor substrate 100 which may define an active region. In embodiments, a well may be formed on and/or over an active region of a substrate. In embodiments, a method of manufacturing a device separator may include sequentially laminating a pad oxide film, a nitride film and/or an oxide film on and/or over semiconductor substrate 100, which may include an active region and/or a device separation region distinguished from an active region, to prepare a hard mask film.

According to embodiments, photoresist may be applied on and/or over semiconductor substrate 100 including a hard mask film. In embodiments, a coated substrate may be subjected to exposure and/or development, to form a photoresist pattern to expose a surface of an oxide film on and/or over which a device separator may be positioned. In embodiments, a photoresist pattern may be used as an etching mask. In embodiments, a pad oxide film, nitride film and/or a oxide film over an exposed region may be selectively removed, which may prepare a hard mask film pattern including etched films, for example an etched pad oxide film, nitride film and/or oxide film. In embodiments, a photoresist pattern may be substantially removed. In embodiments, a prepared hard mask film pattern may be used as an etch mask to etch an exposed surface of semiconductor substrate 100 to a desired depth, to obtain a trench.

According to embodiments, a trench may be formed. In embodiments, an embedding insulation layer may be formed on and/or over semiconductor substrate 100 which may embed a trench and/or may be subjected to planarization by chemical mechanical planarization (CMP). In embodiments, a device separator may be formed to limit and/or defining an active region of substrate 100. In embodiments, an embedding insulation layer may include a high density plasma-undoped silicate glass (HDPUSG) film.

Referring to FIG. 1A, tunnel oxide film 120, first polysilicon layer 140, interlayer insulating film 160 and/or second polysilicon layer 180 may be deposited, for example sequentially, on and/or over a surface of semiconductor substrate 100, for example substantially the entire surface of semiconductor substrate 100. According to embodiments, first polysilicon layer 140 may be for a floating gate. In embodiments, interlayer insulating film 160 may include a ONO structure.

Figure 1B:
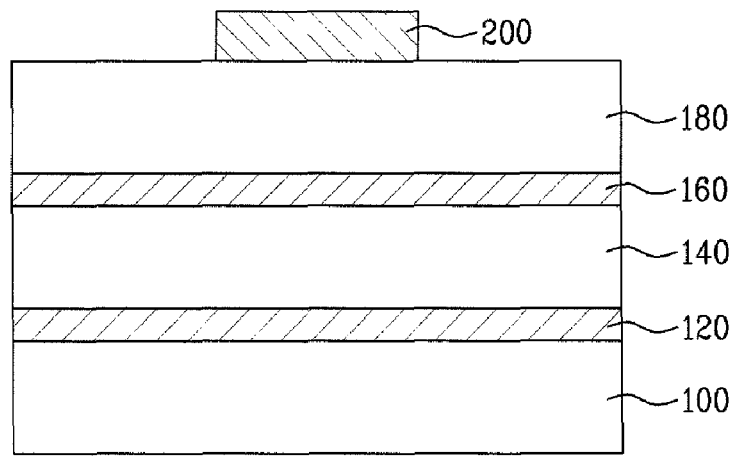

Referring to FIG. 1B, a low temperature oxide (LTO) film configured to be deposited at a relatively low temperature relative to a temperature for wet oxidation, for example between approximately 180° C. and 220° C., may be formed on and/or over second polysilicon layer 180. According to embodiments, a LTO film may be formed including a thickness between approximately 100 Å and 950 Å. In embodiments, process conditions may include between approximately 5 sec and 120 sec, $SiH_4$ including between approximately 130 sccm and 140 sccm and/or $N_2O$ between approximately 150 sccm and 1500 sccm.

According to embodiments, photoresist may be applied to a LTO film. In embodiments, exposure and/or development may expose a part to be patterned, to obtain a photoresist pattern. In embodiments, an exposed LTO film may be etched using a photoresist pattern as a mask, which may produce an LTO film pattern, such as LTO film pattern 200.

Figure 1C:
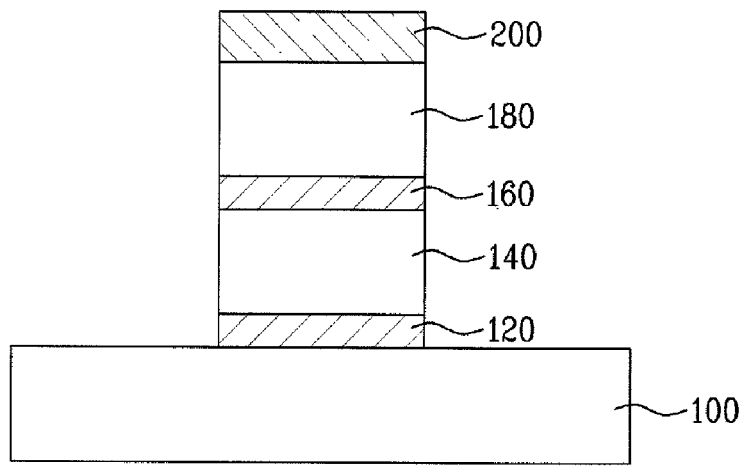

Referring to FIG. 1C, LTO film pattern 200 may be used as a mask to etch tunnel oxide film 120, first polysilicon layer 140 for a floating gate, interlayer insulating film 160 which may include a ONO structure and/or second polysilicon layer 180 to a certain width in a direction substantially perpendicular to a device separator. According to embodiments, a gate pattern may be formed including floating gate 140a, ONO film 160a and/or control gate 180a.

Figure 1D:
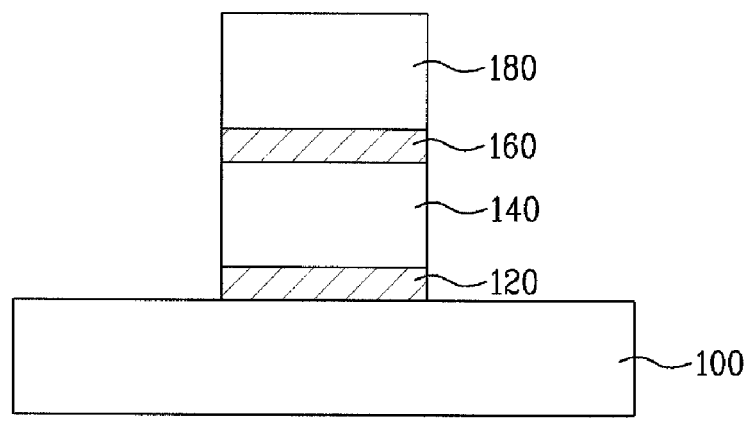

Referring to FIG. 1D, LTO film pattern 200 may be substantially removed by a vapor phase cleaning (VPC) process. According to embodiments, LTO film pattern 200 may include a relatively high etching ratio to an HF chemical solution, compared to a hard mask layer including a oxide film, such that removal of a LTO film pattern may be relatively faster than removal of a oxide film. In embodiments, VPC may reference an injection process of HF chemical solution in a gas state using a nozzle. In embodiments, a gas having unisotropic properties rather than a solution having isotropic properties may be employed to minimize damage to a side wall of a gate pattern.

Referring to example FIG. 2, a diagram illustrates results of a method of manufacturing a semiconductor device in accordance with embodiments. FIG. 2 is a graph illustrating a VPC process using a high temperature oxide (HTO) film and a VFC process using a LTO film in accordance with embodiments. According to embodiments, FIG. 2 illustrates an etch amount plotted as a vertical axis and a VPC process time (sec) plotted as a horizontal axis.

According to embodiments, when a HTO film may be deposited at a relatively high temperature, for example approximately 850° C., a relatively denser film may be obtained and/or an etch ratio thereof may be relatively lower than that of a LTO film. In embodiments, a time period to substantially prevent damage to a side wall of a gate pattern may range between approximately 10 sec and 120 sec. In embodiments, an etch ratio of a LTO film may be substantially different than that of a HTO film within a temperature range during the time period.

According to embodiments, an LTO film may be used and/or may be selectively removed by VPC, which may minimize damage to a gate pattern. In embodiments, generation of an undercut may be minimized. In embodiments, an increase in area of forming salicide caused by an undercut during formation of salicide as a post process may be minimized. In embodiments, a channel length between a source and a drain may be minimized.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
   forming a floating gate layer, an interlayer insulating layer and a control gate layer over a semiconductor substrate;
   forming a low temperature oxide film over said control gate layer;
   selectively etching said low temperature oxide film to expose at least a portion of said control gate;
   using said low temperature oxide film as a mask to etch a predetermined part of each of said floating gate layer, said interlayer insulating layer and said control gate to form a gate pattern; and
   substantially removing said low temperature oxide film by wet etching.

2. The method of claim 1, wherein at least one of:
   said semiconductor substrate comprises an active region defined by a device separator; and
   said interlayer insulating layer comprises a oxide-nitride-oxide structure.

3. The method of claim 1, wherein said floating gate layer, interlayer insulating layer and control gate layer are formed in sequential order.

4. The method of claim 1, wherein said low temperature oxide film is formed at a relatively low temperature between approximately 180° C. and 220° C.

5. The method of claim 1, wherein said low temperature oxide film is formed in a process comprising $SiH_4$ between approximately 130 sccm and 140 sccm and $N_2O$ between approximately 150 sccm and 1500 sccm.

6. The method of claim 1, wherein said low temperature oxide film comprises a thickness between approximately 100 Å and 950 Å.

7. The method of claim 1, wherein said low temperature oxide film is substantially removed by a vapor phase cleaning process.

8. The method of claim 7, wherein said vapor phase cleaning process is performed between approximately 10 sec and 120 sec.

9. The method of claim 7, wherein said vapor phase cleaning process comprises injecting a HF chemical solution in a gas state.

10. The method of claim 9, wherein said injecting comprises using a nozzle.

* * * * *